(12) United States Patent
Cummings

(10) Patent No.: US 12,298,335 B2
(45) Date of Patent: *May 13, 2025

(54) TESTING BENCH

(71) Applicant: T-Mobile USA, Inc., Bellevue, WA (US)

(72) Inventor: Oscar R. Cummings, Lynwood, WA (US)

(73) Assignee: T-Mobile USA, Inc., Bellevue, WA (US)

(*) Notice: Subject to any disclaimer, the term of this patent is extended or adjusted under 35 U.S.C. 154(b) by 545 days.

This patent is subject to a terminal disclaimer.

(21) Appl. No.: 17/688,460

(22) Filed: Mar. 7, 2022

(65) Prior Publication Data

US 2022/0187354 A1 Jun. 16, 2022

Related U.S. Application Data

(62) Division of application No. 16/237,080, filed on Dec. 31, 2018, now Pat. No. 11,268,999.

(60) Provisional application No. 62/662,657, filed on Apr. 25, 2018.

(51) Int. Cl.
 *H04B 17/16* (2015.01)
 *G01R 29/08* (2006.01)
 *G01R 31/28* (2006.01)
 *H04B 17/00* (2015.01)
 *H04B 17/29* (2015.01)
 *H04B 17/30* (2015.01)

(52) U.S. Cl.
 CPC ..... *G01R 29/0821* (2013.01); *G01R 29/0878* (2013.01); *G01R 31/2822* (2013.01); *H04B 17/0085* (2013.01); *H04B 17/16* (2015.01); *H04B 17/29* (2015.01); *H04B 17/30* (2015.01)

(58) Field of Classification Search
 CPC ..... H04B 17/16; H04B 17/29; G01R 29/0821
 USPC ..................................... 455/67.11
 See application file for complete search history.

(56) References Cited

U.S. PATENT DOCUMENTS

| 8,295,777 | B1 | 10/2012 | Yenney et al. |
| 9,398,466 | B1 | 7/2016 | Joung et al. |
| 11,268,999 | B2* | 3/2022 | Cummings ........ G01R 29/0821 |
| 2012/0182191 | A1 | 7/2012 | King |

(Continued)

FOREIGN PATENT DOCUMENTS

CN 205986892 U 2/2017

OTHER PUBLICATIONS

English Translation of Li et al., Radio Frequency Transceiver Front End Test Table, 2017 (Year 2017).

(Continued)

*Primary Examiner* — Ayodeji O Ayotunde
(74) *Attorney, Agent, or Firm* — Lee & Hayes, P.C.

(57) ABSTRACT

A testing bench can be used while testing wireless telecommunications devices. In some examples, the testing bench includes a first surface and a second surface that houses a patch panel, a combiner, and/or an attenuator. The testing bench can be located in a shielded enclosure with at least two conductive radio frequencies (RF) shield layers separated by an insulator material. In some examples, the testing bench may receive a radio signal from a radio source located outside of the shielded enclosure and provide the radio signal to a wireless (UE) device under testing via the patch panel, the combiner and/or the attenuator.

20 Claims, 5 Drawing Sheets

(56) References Cited

U.S. PATENT DOCUMENTS

| | | |
|---|---|---|
| 2013/0033279 A1 | 2/2013 | Sozanski et al. |
| 2013/0200915 A1* | 8/2013 | Panagas ............. G01R 31/2893 |
| | | 324/757.01 |
| 2014/0091874 A1 | 4/2014 | Cook et al. |
| 2015/0137829 A1 | 5/2015 | Ho |
| 2019/0004102 A1 | 1/2019 | Gienger |
| 2019/0235003 A1 | 8/2019 | Paulsen et al. |
| 2019/0331719 A1 | 10/2019 | Cummings |
| 2019/0331720 A1 | 10/2019 | Cummings |
| 2019/0391195 A1 | 12/2019 | Kvarnstrand |

OTHER PUBLICATIONS

Office Action for U.S. Appl. No. 16/237,041, mailed on Jan. 26, 2021, Cummings, "Radio Signal Absorption Testing Enclosure", 9 pages.
Office Action for U.S. Appl. No. 16/237,080, mailed on Mar. 3, 2021, Cummings, "Testing Bench", 9 Pages.
Final Office Action for U.S. Appl. No. 16/237,080, mailed on Jun. 30, 2021, Cummings, "Testing Bench", 12 Pages.

\* cited by examiner

TESTING BENCH

CROSS REFERENCE TO RELATED APPLICATIONS

This patent application is a divisional of and claims priority to U.S. patent application Ser. No. 16/237,080, filed Dec. 31, 2018, titled "TESTING BENCH," which claims priority filing benefit from U.S. Provisional Patent Application No. 62/662,657, filed Apr. 25, 2018, the entirety of both which are hereby incorporated by reference, in their entirety.

FIELD OF THE DISCLOSURE

The present disclosure relates generally to testing wireless telecommunications devices and, more particularly, this disclosure relates to a testing system capable of using various testing protocols for testing multiple telecommunications devices.

BACKGROUND

A release of a new product can be a complicated endeavor when the new product includes new technology. Not only do traditional concerns exist about marketing, inventory, and sales of the new product, but other concerns exist that may relate to compatibility, operation, and future costs, among other concerns related to deployment of the new product that includes new technology.

Before a product (e.g., device, system, software, and/or hardware) is implemented in the market and/or made available for consumption, the product often undergoes rigorous testing to ensure that the product is fully functional/operational upon deployment. This testing can be time consuming and expensive, especially when the new product must be tested at multiple types of testing stations that are dispersed in a testing facility.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
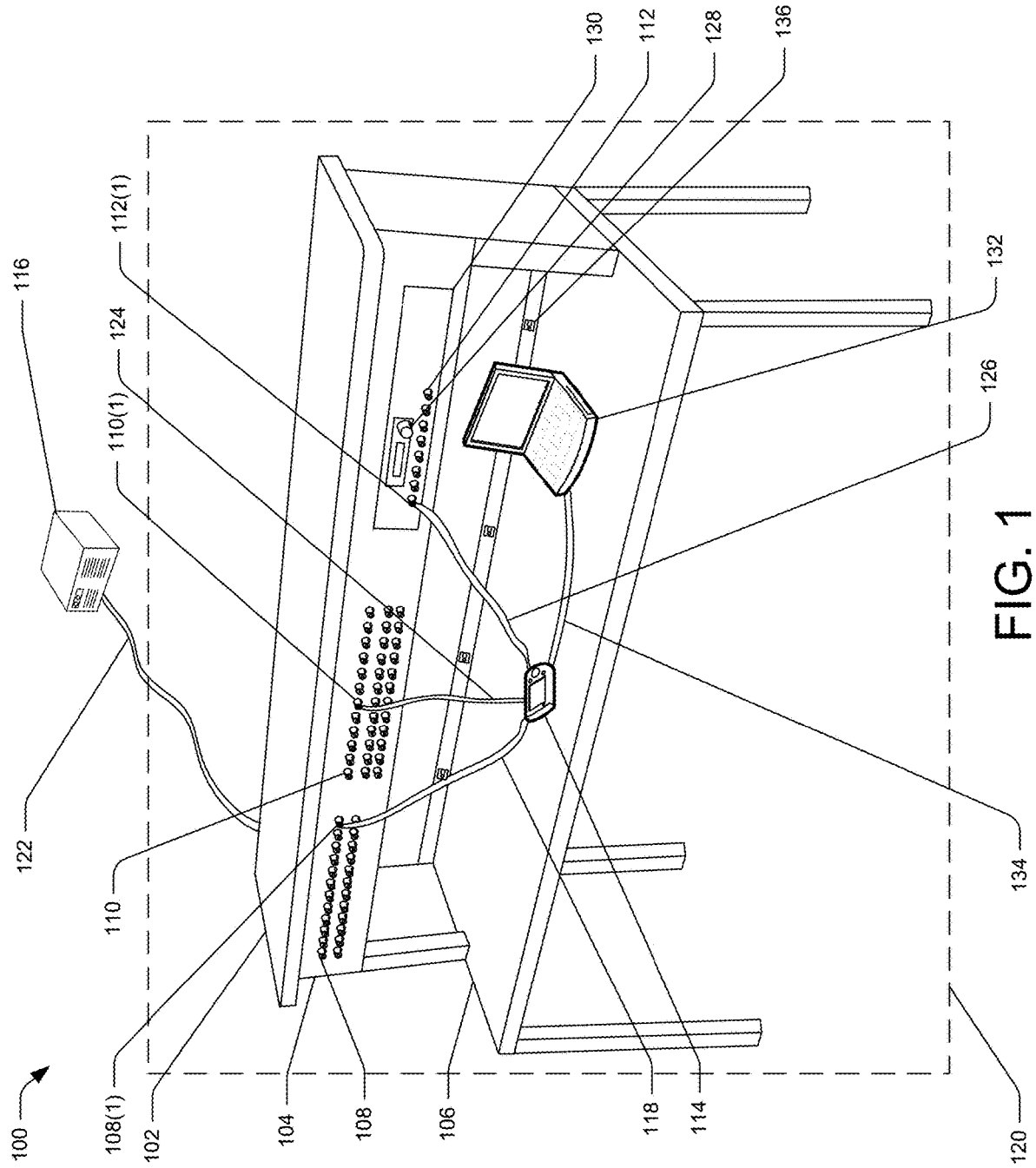
FIG. 1 illustrates an overview of an exemplary testing system which includes a testing bench, in accordance with various implementations of the disclosure.

A testing bench system may be used to perform repeatable testing of a device, such as a telecommunications device (herein referred to as user equipment (UE)), and a radio as the UE operates on a communications network provided by the radio. The UE can operate using a variety of radio access technologies (e.g., 2G, 3G, 4G, 5G, Citizen Broadband Radio Service (CBRS) Wi-Fi, Bluetooth, NFC, etc.) and therefore a large amount of equipment is needed to test all the functionality of the various radio access technologies. Engineers may want to test various aspects of the UE as it operates on different radio signal wavelengths, different combinations of radio signals, and/or different radio signal strengths. Manipulating the radio signal that the UE receives as it is being tested requires many different types and amounts of equipment (e.g., combiners, attenuators, patch panels, etc.). It is therefore desirable to test the UEs at a testing bench enclosure that provides easy access to a radio signal as well as access to a combiner and an attenuator in order to change, combine, reduce, or otherwise affect the radio signal that the UE receives. The testing protocols may be performed within an RF shielded room which shields the UE from ambient RF energy that is unassociated with (e.g. not generated because of) the testing protocols and which may potentially interfere with or otherwise affect the results of the testing protocols. The ambient RF energy may include ambient RF signals, e.g. RF signals generated proximate to the testing environment but unassociated with the testing protocol.

By way of example, and without limitation, the testing bench system can include patch panels, attenuators, combiners, a testbed, a radio source, a power strip, a computing device, and multiple ports to provide access to the components housed by the testing bench enclosure. During a testing protocol, a radio source located outside of the RF shielded room may provide a radio signal (e.g., via a wired connection) to a port located on the testing bench enclosure within the RF shielded room. A UE may be connected to a patch panel port on the testing bench enclosure such that the UE receives the radio signal from the radio source. Additionally, the UE may be connected to a combiner port coupled with a combiner and an attenuator port coupled with an attenuator. Various operations of the UE and/or of the radio can be initiated thereby causing the UE and the radio source to communicate with one another. The operations in the testing protocol may include, without limitation, initiating voice calls, VoLTE calls, transmitting and receiving data (messages, videos, music, etc.), executing applications, browsing the Internet, performing handover events and performing other operations. By initiating operations using the testing bench enclosure such as those described above with respect to the testing protocol, the UE may be tested in a laboratory environment (e.g., with minimal interference from reflected radio signals and/or from external devices) using an automated process and include quick cycle times, improving efficiency and repeatability. Results of the testing protocols may be captured and analyzed to determine performance of the UE and/or the radio, which may be compared to threshold performance metrics or used for other purposes.

The systems, devices, and techniques described herein can be implemented in several ways. Example implementations are provided below with reference to the following figures. It should be appreciated that the subject matter of the disclosure can be reasonably modified, rearranged, or otherwise altered, in accordance with embodiments of the disclosure.

FIG. 1 illustrates an overview of an illustrative testing environment 100 that includes a testing bench 102 having an upper level 104 and a lower level 106. The testing bench 102 may include a row of ports 108, 110, and 112. Each row of ports 108, 110, and 112 may provide a UE 114 access to different testing components of the testing bench 102. For instance, the row of ports 108 may provide the UE 114 access to a radio signal emitted from a radio source 116 by connecting the UE 114 to a port 108(1) via a communication channel 118. The radio source 116 may be located outside of a RF shielded enclosure 120 and may provide the radio signal to the testing bench 102 via a communication channel 122 that passes through an opening of the RF shielded enclosure 120 and into a radio signal port located on the back of the testing bench 102.

The radio signal may include, for example, radio frequency outputs such as Long-Term Evolution (LTE), 3G, 4G, 5G, Citizen Broadband Radio Service (CBRS), Wi-Fi, and so forth. The radio source 116 may provide any type of radio signal to the UE 114 that may enable the UE 114 to perform an action (e.g., initiating voice/video calls, receiving voice/video calls, transmitting and receiving data (messages, videos, music, etc.), executing applications, browsing the Internet, etc.).

The UE 114 may include mobile telephones (including smartphones), netbooks, tablet computers, personal computers, data sticks, network adapters, and other electronic devices that can exchange signals with the radio source 116.

In some instances, the testing bench 102 may provide access to a combiner housed within the testing bench 102. For instance, the row of ports 110 may include a port 110(1) that is connected to the UE 114 by a communication channel 124. The row of ports 110 may enable a tester to combine signals provided by the radio source 116 in order to test functionality of the UE 114 as it receives a combination of radio signals. For example, although only one radio source is illustrated in FIG. 1 (e.g., radio source 116), the testing environment 100 may include multiple radio sources that provide different types of radio signals with different strengths to the UE 114. For example, the testing environment 100 may simulate mobility testing which involves a LTE signal from one eNB handover to another eNB or even to different technology such as WCDMA.

In some instances, the testing bench 102 may provide access to an attenuator housed within the testing bench 102. For instance, the row of ports 112 may include a port 112(1) that is connected to the UE 114 by a communication channel 126. The row of ports 112 may enable a tester to attenuate a radio signal that the UE 114 receives from the radio source 116 by adjusting a dial 128 located on an attenuator panel 130. In accordance with one or more embodiments, the radio signal from the radio source 116 may be modified by the attenuator to enable simulation of signals deployed in a field environment (i.e., replicate live network scenarios) while in a lab or testing environment. For example, a user may desire to test an operation of the UE 114 when subjected to signals that simulate a dense urban environment where signals reflect off of buildings and other man-made or natural features of the field environment. In these embodiments, the radio signals from the radio source 116 may be processed by the attenuator via the dial 128 to simulate a decrease in signal strength.

The testing bench system may also include a computing device 132 that may be connected to the UE 114 by a communication channel 134 such that the computing device 132 may cause the UE 114 to perform actions and to store results of those actions. For instance, the computing device 132 may cause the UE 114 to perform various actions (e.g., initiating voice calls, transmitting and receiving data (messages, videos, music, etc.), executing applications, browsing the Internet, etc.) while the UE 114 is receiving the radio signal from the radio source 116. While the actions are being performed, engineers may manipulate the radio signal by adjusting a combination of the radio signals using the row of ports 110 and/or attenuating the signal using the row of ports 112 and the dial 128. The computing device 132 may store the results of the actions as the radio signal is being manipulated.

In some instances, the testing bench 102 may include a power strip 136 that may be used to charge a battery of the UE 114 or the computing device 132. In some instances, the testing bench 102 may include other ports or communication channels not shown in FIG. 1, such as a USB port, an ethernet port, a firewire port, SMA type connectors, QMA type connectors or the like.

In some cases, the testing bench 102 may provide a signal to a device (e.g., another UE, a radio, etc.) within the RF shielded enclosure 120 and then wirelessly communicated to a second UE, such as the UE 114.

Figure 2:
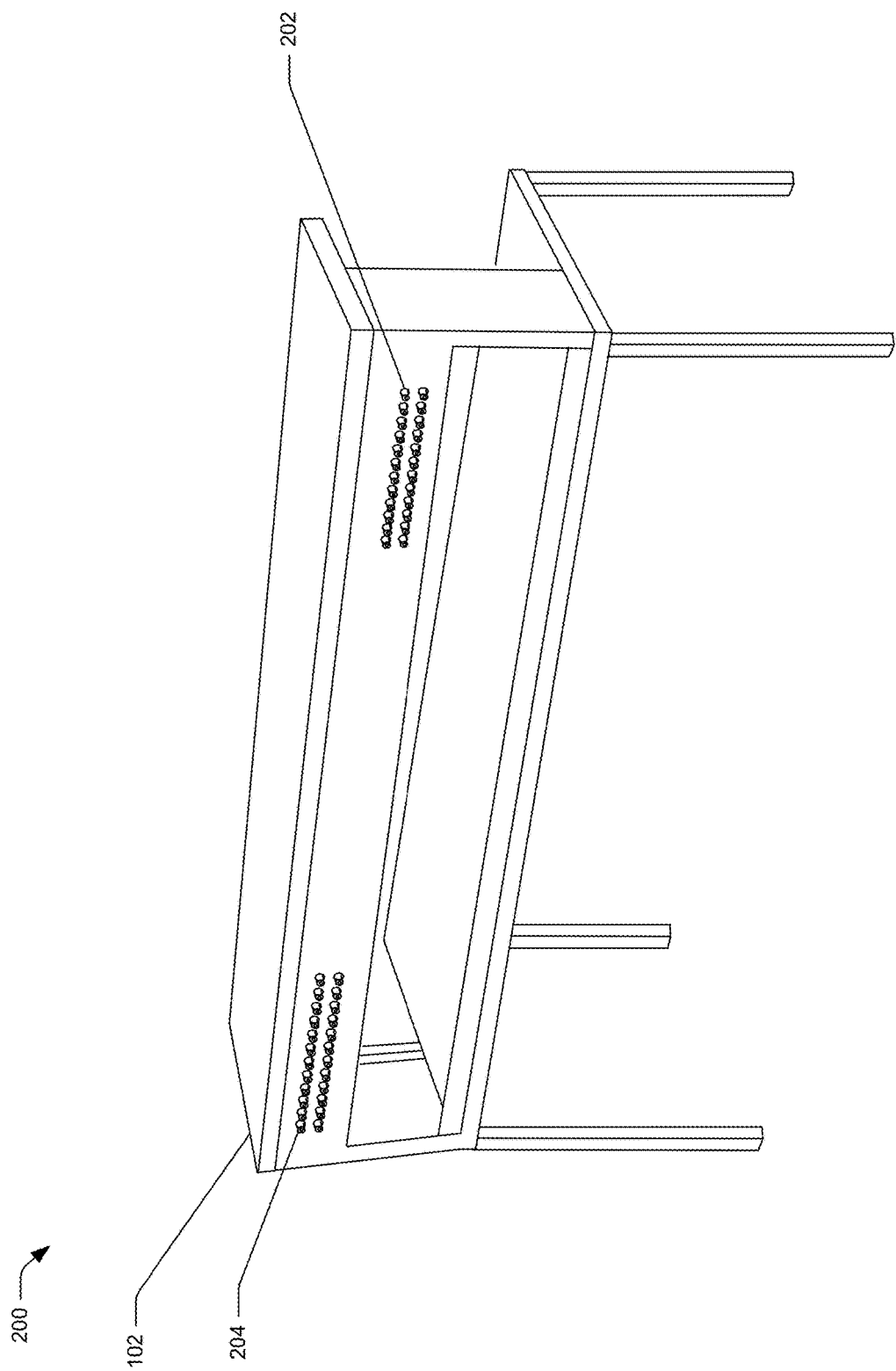
FIG. 2 illustrates the testing bench of the testing system shown in FIG. 1 from another angle, in accordance with various implementations of the disclosure.

Referring now to FIG. 2, the back side of the testing bench 102 may include a row of ports 202 that may include a radio signal port for connecting to the radio source 116 and provide the UE 114 a radio signal via the row of ports 108. Additionally, the testing bench 102 may include a row of ports 204 that may connect the radio source to the attenuator located within the testing bench 102 and enable a tester to attenuate the radio signal that the UE 114 receives from the radio source 116. Although only the row of ports 202 and 204 are shown on the backside of the testing bench 102 in FIG. 2, any number of ports may be included in the testing bench 102 in order to provide the UE 114 access to equipment that may be necessary for testing.

Figure 3:
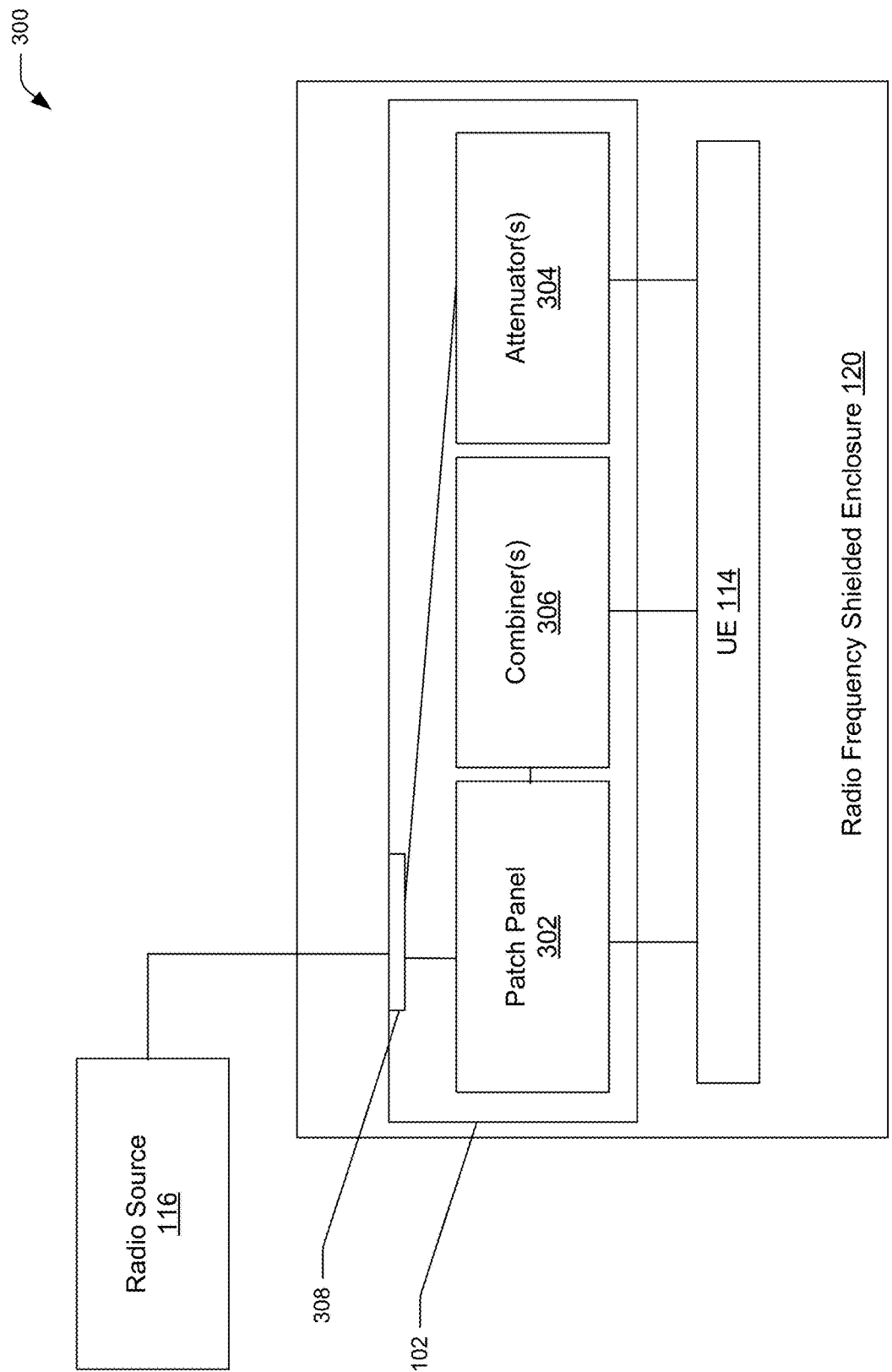
FIG. 3 illustrates a block diagram including components of the testing system shown in FIG. 1, in accordance with various implementations of the disclosure.

FIG. 3 is a block diagram of an illustrative testing architecture 300 to enable configuration and modification of a radio signal via the testing bench 102 for testing with the UE 114. The architecture 300 shows the radio source 116 located outside of the RF shielded enclosure 120 and providing a radio signal to the testing bench 102 located within the RF shielded enclosure 120. In some embodiments, the radio signal may be provided directly to a patch panel 302 via a radio signal port 308 and an attenuator 304 such that the patch panel 302 may provide the radio signal as an output to the UE 114 and the attenuator 304 may modify (e.g., attenuate) the radio signal as the UE 114 performs an operation. The attenuator 304 may include a variable attenuator having any number of ports, such as 12 ports. In some embodiments a combiner 306 may be used to connect to the patch panel 302 and combine radio signals outputted from the patch panel 302. The combiner 306 may include a 2:1 or 4:1 combiner. For example, in addition to the radio source 116, multiple radio sources may provide multiple radio signals to the patch panel 302, which, in turn, may provide the radio signals to the UE 114. These radio signals may vary in type and/or strength. The combiner 306 may enable engineers to combine different radio signals that are provided to the UE 114 while the UE 114 is under test. In addition to the radio signal port 308, multiple radio signal ports may be used to receive the radio signal and provide the radio signal to either the patch panel 302 and/or the attenuator 304.

Figure 4:
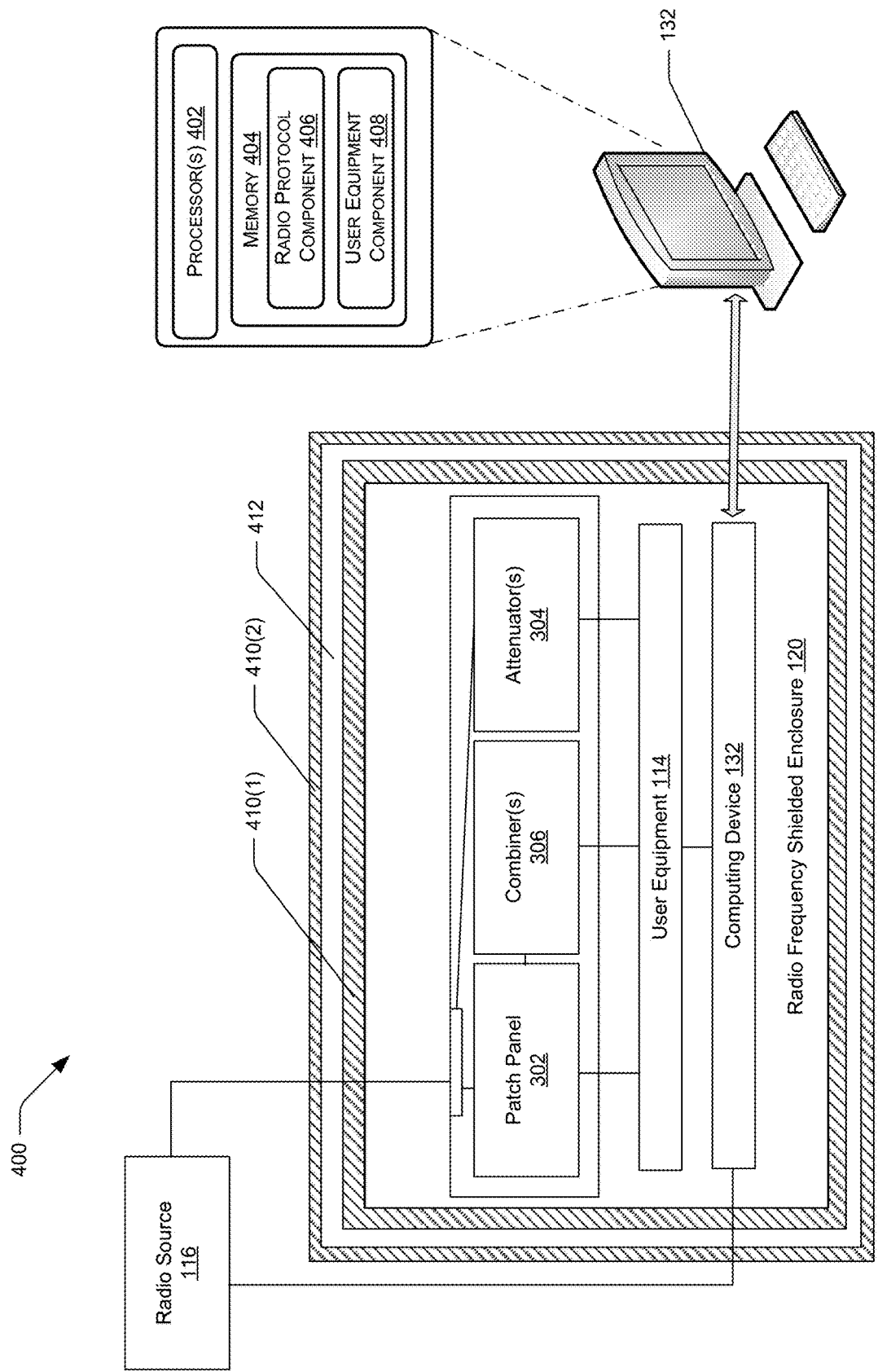
FIG. 4 illustrates a block diagram including components of the testing system shown in FIG. 1, in accordance with various implementations of the disclosure.

FIG. 4 is a block diagram of an illustrative testing architecture 400 to enable configuration and modification of a radio signal via the testing bench 102 for testing with the UE 114 and the computing device 132. In some embodiments, the radio signal may be provided directly to the patch panel 302 and the attenuator 304 such that the patch panel 302 may provide the radio signal as an output to the UE 114 and the attenuator 304 may modify the radio signal as the UE 114 performs an operation. In some embodiments, the combiner 306 may be connected to the patch panel 302 and modify a combination of radio signals outputted from the patch panel 302. The computing device 132 may be equipped with one or more processor(s) 402 and memory 404. The memory 404 may include applications, components, and/or data. In some embodiments, the memory 404 may include a radio protocol component 406 and a UE component 408 to perform test scenarios on the radio source 116 and the UE 114.

The radio protocol component 406 may generate and transmit instructions that cause the radio source 116 to broadcast a network such that the UE 114 may operate on the network. For example, the radio protocol component 406 may be coupled to the radio 116 through one or more connectors of the RF shielded enclosure 120, e.g. SMA type end connectors, to enable the radio source 116 to function as an RF base station for testing one or more of the functionalities or features of the UE 114 under test. The radio protocol component 406 may cause the radio source 116 to function as a radio signal such as LTE, 3G, 4G, 5G, CBRS, Wi-Fi, and so forth. In some embodiments, the radio protocol component 406 may generate and transmit instructions to cause the radio source 116 to receive signal data representing a RF signal transmitted from the UE 114. The radio protocol component 406 may then store the signal data in the memory 404 of the computing device 132. In some examples, the signal data may indicate a signal strength at which the UE 114 receives the broadcasted network.

In some instances, the radio protocol component 406 may be configured to control one or more of a $3^{rd}$ Generation (3G) base station, a $4^{th}$ Generation (4G) base station, a $5^{th}$ Generation (5G) base station, a dual-connectivity base station or base station system (e.g., configured to communicate in accordance two or more 3G, 4G, or 5G protocols).

The UE component 408 may generate and transmit instructions that cause the UE 114 to perform operations while connected to the test bench 102. For example, the UE component 408 may cause the UE 114 to turn on, access a network broadcast by the radio source 116, and perform operations such as, but not limited to, initiating voice/video calls, receiving voice/video calls, transmitting and receiving data (messages, videos, music, etc.), executing applications, browsing the Internet, and performing other operations. In some examples, the UE component 408 may be configured to receive measurement data indicating a performance metric of an operation performed by the UE 114. In some examples, the UE component 408 may cause the UE 114 to transmit an RF signal to be received by the radio source 116. The RF signal may include a signal strength at which the UE 114 receives the broadcasted network. In some instances, the UE component 408 can be configured to receive measurement data associated with the RF signal received by the UE 114, such as frequency, signal strength, signal-to-interference-plus-noise ratio (SINR), throughput performance, Core functionalities, new features, among others.

In some embodiments, the computing device 132 may include a display screen for displaying information associated with the testing. In accordance with various embodiments, the computing device 132 may include a monitor, which may display a user interface (UI) to enable the user to interact with the various components of the memory 404.

The computing device 132 may be positioned either in the interior or in the exterior of the RF shielded enclosure 120. In some embodiments, the computing device 132 can be positioned within the RF shielded enclosure 120 and can be communicatively coupled to the UE 114 by the communication channel 134. Any one of the communication channels 118, 122, 124, 126, and/or 134 may be an optical fiber to limit the electrical signal current transmitted within the RF shielded enclosure 120. Transmitting information as pulses of light does not emit RF radiation and may be less susceptible to RF interference. In some embodiments, the communication channels 118, 122, 124, 126, and/or 134 may include a conductive wire type connection, e.g. a wire configured to transmit data via electric pulses such as a USB cable, or a wireless communication link between an RF antenna within the RF shielded enclosure 120.

In some embodiments, the RF shielded enclosure 120 may include two or more conductive layers 410 for providing suitable isolation at relevant frequencies. Conductive layers 410 may be made from any material suitable for shielding the relevant frequencies of RF energy such as, for example, aluminum, copper, or steel. Furthermore, the conductive layers 410 may designed to provide substantial shielding effectiveness such as, e.g. higher than 60 dB or higher than 80 dB. In some embodiments, the conductive layers 410 may be flexible in nature (as opposed to rigid) such as a cloth material embedded with stainless steel as the RF carrier material used to absorb and/or shield RF energy. In some embodiments, the conductive layers 410 may be a solid metallic sheet material, e.g. an aluminum sheet metal. In some embodiments, the conductive materials 410 may be separated by an insulator 412 such as, for example, a non-conductive foam or an air gap. Conductive layers 410 may function as a Faraday cage to block external signals from entering the interior region RF shielded enclosure 120 and to prevent interference during testing of the UE 114. In some embodiments, the conductive materials 410 may be connected to a ground path to enable dissipation of any absorbed energy.

Figure 5:
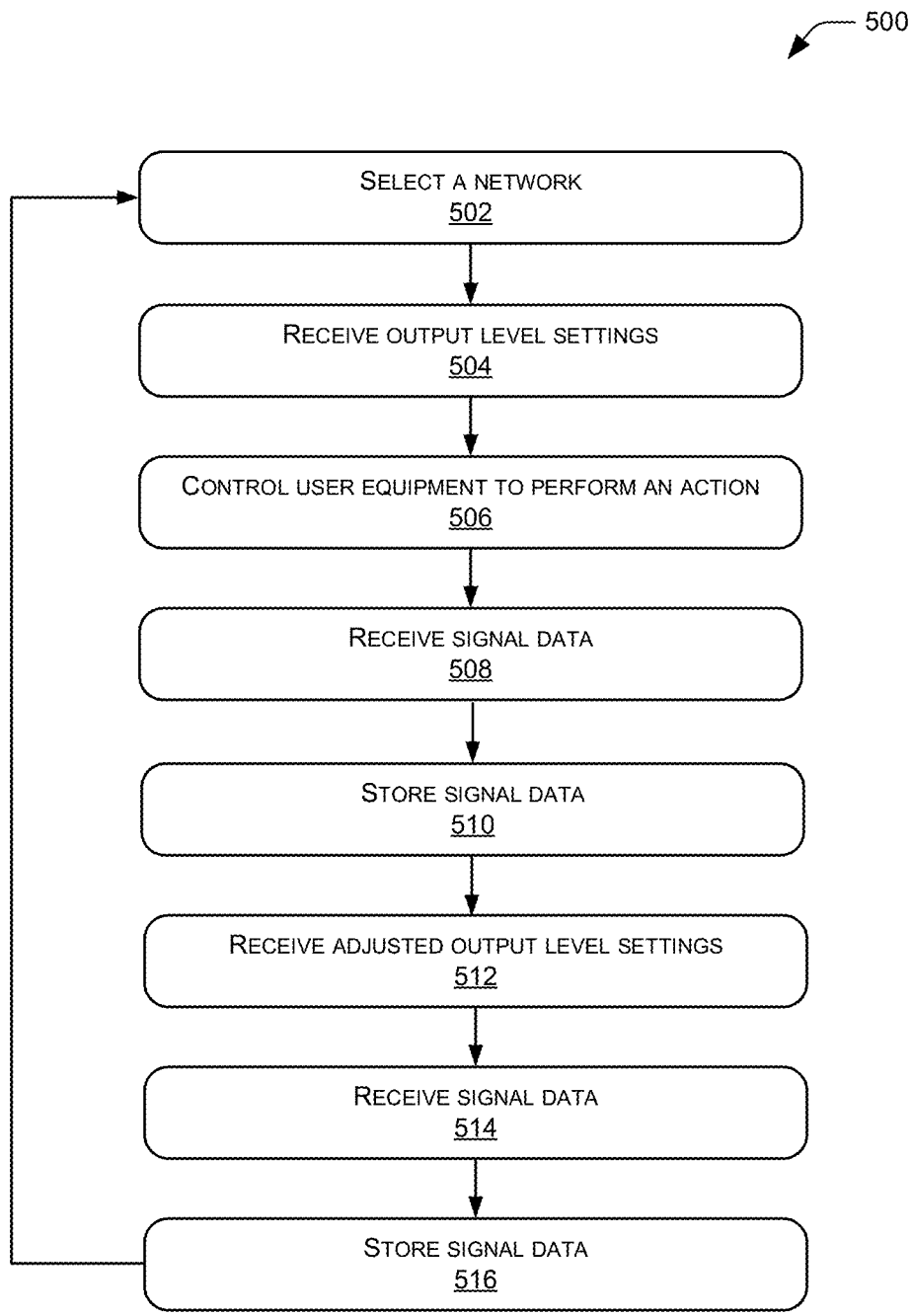
FIG. 5 is a flow diagram of an illustrative process of a computing device capturing radio signal data from a user equipment (UE) while the UE is undergoing testing, in accordance with embodiments of the disclosure.

FIG. 5 illustrates an example process in accordance with embodiments of the disclosure. This process is illustrated as a logical flow graph, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the process.

FIG. 5 is a flow diagram of an illustrative process 500 of a computing device capturing signal data from a UE while the UE is securely enclosed within a radio frequency shielded enclosure, in accordance with embodiments of the disclosure. The example process 500 can be performed by the computing device 132 in conjunction with the radio source 116 and/or the UE 114, in connection with other components discussed herein. Some or all of the process 500 can be performed by one or more devices, equipment, or components illustrated in FIGS. 1-4, for example.

At operation 502, the computing device may select a network. In some embodiments, the radio protocol component 406 of the computing device 132 may select one or more network configurations of the radio source 116. For example, the radio protocol component 406 may cause the radio source 116 to emit a radio signal, such as, but not limited to LTE, 3G, 4G, 5G, CBRS, Wi-Fi, and so forth.

At operation 504, the computing device may receive output level settings. For example, the engineer may adjust the combination of the radio signals emitted by the radio source 116 (and/or additional radio sources) to the UE 114 via the combiner 306 and the computing device 132 may receive the details of the combination via user input. In some embodiments, the computing device 132 may be connected to the combiner 306 and may receive the details of the combination from the combiner 306. In some embodiments, the output level information and/or information about the combiner 306 or other components can be input manually into the computing device 132. In some embodiments, the computing device 132 may receive an indication that the radio signals emitted by the radio source 116 to the UE 114 have been attenuated via the attenuator 304.

At operation 506, the computing device may control the UE to perform an action. For example, the UE component of the computing device 132 may cause the UE 114 to turn on, access a network broadcast by the radio source 116, and perform operations such as, but not limited to, initiating voice/video calls, receiving voice/video calls, transmitting and receiving data (messages, videos, music, etc.), running applications, browsing the Internet, and performing other operations. In some examples, the UE component 408 may cause the UE 114 to transmit an RF signal to be received by the radio source 116. The RF signal may include a signal strength at which the UE 114 receives the broadcasted network. In some examples, the operation 506 can further include controlling the radio source 116 to communicate with the UE 114 using a particular frequency, polarization, and/or communication technology (e.g., 3G, 4G, or 5G).

At operation 508 the computing device may receive signal data. For example, the radio protocol component 406 of the computing device 132 may generate and transmit instructions to cause the radio source 116 to receive signal data representing a RF signal transmitted from the UE 114. In some examples, the signal data may indicate a signal strength at which the UE 114 receives the broadcasted network. In some examples, the operation 508 can include the computing device 132 receiving signal data representing a RF signal captured by the UE 114 and broadcast by the radio source 116. In some examples, the received signal data may include a result of an action performed by the UE 114. For example, the signal data may indicate a speed at which an operation (e.g., initiating voice calls, transmitting and receiving data (messages, videos, music, etc.), running applications, browsing the Internet, and performing other operations) was performed.

At operation 510 the computing device may store the signal data. For example, the radio protocol component 406 and/or the UE component 408 may store the signal data in the memory 404 of the computing device 132.

At operation 512, the computing device may receive adjusted output level settings. For example, the computing device 132 may receive user input indicating that an adjustment has been made via the combiner 306 and/or the attenuator 304. In some examples the computing device 132 may receive the adjustment information via a wired or wireless connection to the combiner 306 and/or the attenuator 304. In some examples, the adjustment information can be input manually into the computing device 132.

At operation 514, the computing device may receive signal data. For example, the radio protocol component 406 of the computing device 132 may generate and transmit instructions to cause the radio source 116 to receive signal data representing a RF signal transmitted from the UE 114. In some examples, the signal data may indicate a signal strength at which the UE 114 receives the adjusted network. In some examples, the operation 514 can include the computing device 132 receiving signal data representing a RF signal captured by the UE 114 and broadcast by the radio source 116. In some examples, the received signal data may include a result of an action performed by the UE 114 while the UE 114 is experiencing the adjusted output levels. For example, the signal data may indicate a speed at which an operation (e.g., initiating voice calls, transmitting and receiving data (messages, videos, music, etc.), running applications, browsing the Internet, and performing other operations) was performed at the adjusted output levels.

At operation 516 the computing device may store the signal data. For example, the radio protocol component 406 and/or the UE component 408 may store the signal data that is associated with the adjusted output levels in the memory 404 of the computing device 132.

In some instances, the process 500 can be performed iteratively to substantially exhaustively test combinations of frequencies, actions, combinations, attenuations, and the like available to test for a radio source and/or UE. Accordingly, the systems, devices, and techniques discussed herein can efficiently and safely test a variety of devices in a repeatable manner.

Although the subject matter has been described in language specific to structural features and/or methodological acts, it is to be understood that the subject matter defined in the appended claims is not necessarily limited to the specific structural features or acts described. Rather, the specific structural features and acts are disclosed as exemplary forms of implementing the claims. The scope of the present disclosure and appended claims is not limited by these exemplary forms. In particular, numerous variations, whether explicitly provided for by the specification or implied by the specification, such as variations in structure features and/or methodological acts, whether now known in the art or subsequently developed, may be implemented by one of skill in the art in view of this disclosure.

What is claimed is:

1. A test bench apparatus comprising:
   a first surface at a first height, wherein the first surface is substantially horizontal; and
   a second surface at a second height that is above the first height, the second surface being substantially vertical and including:
   at least one attenuator port coupled with at least one attenuator;
   at least one combiner port coupled with at least one combiner;
   at least one patch panel port coupled with at least one patch panel; and
   at least one radio signal port for receiving a radio signal.

2. The test bench apparatus of claim 1, wherein one or more of the at least one attenuator port, the at least one combiner port, or the at least one patch panel port are configured to couple with a user equipment (UE) for testing.

3. The test bench apparatus of claim 2, wherein the at least one patch panel port is coupled with the UE and configured to provide the radio signal from a radio source to the UE.

4. The test bench apparatus of claim 2, wherein the at least one combiner port is coupled with the UE and is configured to control a combination of the radio signal and at least one additional signal provided to the UE.

5. The test bench apparatus of claim 2, wherein the radio signal comprises a first radio signal, the at least one radio signal port comprises a first radio signal port, the at least one attenuator port comprises a first attenuator port, and the at least one combiner port comprises a first combiner port, the test bench apparatus further comprising a second radio signal port configured to receive a second radio signal, a second combiner port, and a second attenuator port.

6. The test bench apparatus of claim 5, wherein the at least one attenuator and the at least one combiner are configured to initiate a handover event of the UE from the first radio signal to the second radio signal.

7. The test bench apparatus of claim 1, wherein the radio signal includes at least one of Long Term Evolution (LTE), 3G, 4G, 5G, Citizen Broadband Radio Service (CBRS), or Wi-Fi.

8. The test bench apparatus of claim 1, wherein the test bench apparatus is disposed within a shielded room comprising a Faraday cage, and wherein a radio source providing the radio signal is located outside of the shielded room.

9. The test bench apparatus of claim 1, wherein the at least one attenuator is coupled to a first number of ports arranged in a first horizontal row and the at least one combiner is coupled to a second number of ports arranged in a second horizontal row.

10. The test bench apparatus of claim 9, wherein the at least one patch panel is coupled to a third number of ports arranged in a third horizontal row, the first number of ports being different than the second number of ports and the third number of ports.

11. The test bench apparatus of claim 1, further comprising a dial coupled to the at least one attenuator configured to adjust the at least one attenuator.

12. A test bench apparatus comprising:
a first surface at a first height, wherein the first surface is substantially horizontal; and
a second surface at a second height that is above the first height, the second surface being substantially vertical and including:
at least one radio signal port for receiving a radio signal, wherein at least one attenuator is coupled to a first number of ports arranged in a first horizontal row, at least one combiner is coupled to a second number of ports arranged in a second horizontal row, and at least one patch panel is coupled to a third number of ports arranged in a third horizontal row, the first number of ports being different than the second number of ports and the third number of ports; and
a radio source communicatively coupled to the at least one radio signal port to provide the radio signal.

13. The test bench apparatus of claim 12, wherein one or more of the at least one attenuator, the at least one combiner, or the at least one patch panel are configured to couple with a user equipment (UE) for testing.

14. The test bench apparatus of claim 13, wherein the at least one patch panel is coupled with the UE and configured to provide the radio signal from a radio source to the UE.

15. The test bench apparatus of claim 13, wherein the at least one combiner is coupled with the UE and is configured to control a combination of the radio signal and at least one additional signal provided to the UE.

16. The test bench apparatus of claim 13, wherein the radio signal comprises a first radio signal, the at least one radio signal port comprises a first radio signal port, the at least one attenuator comprises a first attenuator, and the at least one combiner comprises a first combiner, the test bench apparatus further comprising a second radio signal port configured to receive a second radio signal, a second combiner port, and a second attenuator port.

17. The test bench apparatus of claim 16, wherein the at least one attenuator and the at least one combiner are configured to initiate a handover event of the UE from the first radio signal to the second radio signal.

18. The test bench apparatus of claim 12, wherein the radio signal includes at least one of Long Term Evolution (LTE), 3G, 4G, 5G, Citizen Broadband Radio Service (CBRS), or Wi-Fi.

19. The test bench apparatus of claim 12, wherein the test bench apparatus is disposed within a shielded room comprising a Faraday cage, and wherein the radio source is located outside of the shielded room.

20. The test bench apparatus of claim 12, further comprising a dial coupled to the at least one attenuator configured to adjust the at least one attenuator.

* * * * *